United States Patent [19]

Miyauchi et al.

[11] Patent Number: 4,687,939
[45] Date of Patent: Aug. 18, 1987

[54] METHOD AND APPARATUS FOR FORMING FILM BY ION BEAM

[75] Inventors: Tateoki Miyauchi, Yokohama; Hiroshi Yamaguchi, Fujisawa; Mikio Hongo, Yokohama; Katsuro Mizukoshi, Yokohama; Akira Shimase, Yokohama; Ryohei Satoh, Yokohama, all of Japan

[73] Assignee: Hitachi, Ltd., Tokyo, Japan

[21] Appl. No.: 668,843

[22] Filed: Nov. 6, 1984

[30] Foreign Application Priority Data

Nov. 7, 1983 [JP] Japan ................................. 58-207433
Mar. 28, 1984 [JP] Japan ................................. 59-58230

[51] Int. Cl.⁴ ........................................... H01J 37/00
[52] U.S. Cl. .............................................. 250/492.2
[58] Field of Search .................... 250/492.21; 427/38

[56] References Cited

U.S. PATENT DOCUMENTS

| | | | |
|---|---|---|---|
| 3,117,022 | 1/1964 | Bronson et al. | 250/492.21 |
| 3,525,013 | 8/1970 | Pelton | 315/111 |
| 3,547,074 | 12/1970 | Hirschfeld | 250/492.21 |
| 3,583,361 | 6/1971 | Laudel | 250/492.21 |
| 4,152,478 | 5/1979 | Takagi | 428/221 |
| 4,381,453 | 4/1983 | Cuomo et al. | 250/492.21 |
| 4,385,946 | 5/1983 | Finegan et al. | 250/492.21 |
| 4,476,393 | 10/1984 | Taya et al. | 250/492.21 |
| 4,556,798 | 12/1985 | McKenna et al. | 250/492.2 |
| 4,563,587 | 1/1986 | Ward et al. | 250/492.2 |

OTHER PUBLICATIONS

"Method of Making Coating of Pure Metal", Russell, *IBM Tech. Disclosure Bull.*, vol. 2, No. 4, Dec. 1959, pp. 12–13.

*Primary Examiner*—Bruce C. Anderson
*Attorney, Agent, or Firm*—Antonelli, Terry & Wands

[57] ABSTRACT

An ion beam apparatus which comprises an enclosure defining a chamber of high vacuum. A crucible for producing vapor of a material, ionizing means, ion accelerating means, and a substrate to be deposited with the vaporized material to thereby form a film thereon are disposed within the chamber. An accelerating voltage is applied across the crucible and the accelerating means such that the crucible is of positive polarity while the accelerating means is of negative polarity. The material contained in the crucible is vaporized by heating. A pressure difference is maintained between the vapor pressure within the crucible and the vacuum chamber. The crucible is provided with a small hole for ejecting the vapor of the material into the vacuum chamber to thereby form atom clouds referred to as clusters under adiabatic expansion and supercooling, a part of the clusters being ionized through irradiation of electrons by the ionizing means and accelerated by the accelerating means so that the ionized and accelerated clusters deposit on the substrate to form a thin film thereon. The apparatus further comprises electrostatic optical system interposed between the cluster ionizing region and the substrate to be deposited with the ionized clusters, wherein the electrostatic optical system serves to focus the ionized clusters onto the element to form the thin film thereon through deposition of the ionized clusters.

6 Claims, 28 Drawing Figures

METHOD AND APPARATUS FOR FORMING FILM BY ION BEAM

The present invention relates in general to a method and an apparatus for forming a film by using an ion beam. In more particular, the invention concerns a method and an apparatus which are suited for selectively forming a film or films at a preselected region or regions of a substrate by focussing the ion beam by making use of the electric charge carried by ions.

FIG. 1 of the accompanying drawings shows a typical example of ion-plating process known heretofore.

Referring to the figure, a vacuum container 2 adapted to be evacuated by means of a vacuum pump (not shown) through an evacuation pipe 1 accommodates therein a crucible 4 which contains material to be evaporated or vaporized for vacuum deposition of a substrate 5. A voltage is applied across the crucible 4 and a substrate holder 6a which supports the substrate 5. In carrying out the vapor deposition, the material 3 to be evaporated is heated up by a heating device 7a to be vaporized. Since a voltage is applied across the material 3 and the substrate 5 by way of the crucible 4 and the substrate holder 6a, respectively, vaporized particles 8a of the material 3 are electrically charged, resulting in that ions thus produced are caused to impinge onto the substrate 5 to be deposited thereon. This process is what is referred to as the ion-plating process in which ions of vaporized material having corresponding thermal energy are caused to impinge on the substrate with acceleration energy to be deposited thereon. In this case, it is however noted that the substrate 5 is deposited with the film forming material 3 uniformly over the whole surface. Accordingly, if a film is to be formed at predetermined regions or areas of the substrate through the ion-plating process, a uniform film has to be first formed over the whole surface of the substrate, which must then be followed by selective removal of the film at the unwanted regions through photographical patterning and etching or the like process to thereby allow the deposited film material to be left only at the desired predetermined regions. This procedure is apparently very complicated and time-consuming.

FIG. 2 of the accompanying drawings shows a typical example of a cluster beam vacuum-deposition technique known heretofore. Referring to the figure, a vacuum container 2 adapted to be evacuated by means of a vacuum pump (not shown) through an evacuation pipe 1 contains a crucible 4 in which a material 3 to be evaporated for vacuum deposition of a substrate 5 is placed. A holder 6b supporting the substrate 5 can be maintained at a high temperature through electrical heating. On the other hand, the substrate 5 is held at a high voltage level relative to the ground by applying a high voltage thereacross. The crucible 4 is adapted to be heated by heating means such as electron beam irradiation means (not shown) so that the material 3 contained in the crucible 4 can be molten and vaporized. The crucible 4 is further provided with a nozzle 7b for blowing off or ejecting the vapors of the material 4. The vapor of the material 4 ejected through the nozzle 7b under pressure determined by nozzle design factors and the pressure within the crucible 4 which is higher than the pressure within the vacuum chamber 2 by several orders of magnitude form atom clouds or clusters 8b each constituted by several tens to several thousands of loosely combined atoms, which clusters run toward the substrate 5. When the atom clusters encounter flux of electrons in the course of travelling toward the substrate 5, a part of the clusters is ionized, as the result of which the ionized clusters are accelerated to impinge with increased energy onto the substrate 5 to be deposited thereon, since the substrate 5 is maintained at the high potential level as mentioned above. In this manner, a major part of the clusters blown off through the nozzle 7b are accumulatively deposited at a relatively low energy level on the order of 1 eV, while the ionized clusters are caused to deposit on the substrate 5 at an increased energy level of several KeV due to the acceleration. Through deposition of the vaporized material or substance 3 on the heated substrate 5 in the manner mentioned above, a film of an improved quality can be formed on the substrate with an enhanced controllability.

Also in the case of the cluster beam deposition technique mentioned above, deposition takes place uniformly over the whole surface of the substrate as in the case of the first mentioned ion-plating method. Accordingly, when a particular region or regions of the substrate surface are to be selectively formed with a film through deposition of the vaporized material, it is required that the vapor deposition is once performed over the whole surface of the substrate and the material deposited on the substrate surface at the unwanted region or regions is subsequently removed selectively by resorting to the photographic patterning and etching or the like lithography technique. This process is thus very complicated and time-consuming, and presents a serious drawback.

FIG. 3 shows another example of the conventional cluster beam vapor deposition system. There are housed within a vacuum chamber 2 adapted to be evacuated by a vacuum pump (not shown) through an evacuation pipe 1 a plurality of crucibles 4 containing a material or substance to be vaporized and a substrate 5 to be deposited with the evaporated material. The substrate 5 is mounted on a substrate holder 6b arranged to be maintained at a high temperature through electrical heating. A high voltage is applied across the substrate holder 6b and the ground so that the substrate 5 is at a high potential level relative to the ground. The plurality of crucibles 4 are heated by appropriate heating means such as electron beam irradiation means so that the material or substance 3 placed therein is molten to be evaporated. Each of the crucibles 4 is provided with a nozzle 7b to blow off the vapor of the material 3 therethrough. From the vapors blown off through the nozzles 7b under the pressure which is determined by the nozzle design factors and the pressure in the crucible 4 which is higher than the pressure the vacuum chamber 2 by several orders of magnitude, there are produced clusters 8b each including several thousands of loosely combined atoms, which clusters run towards the substrate 5. In the course of the travelling, a part of the clusters is ionized (i.e. electrically charged) due to flux of electrons as indicated by ⓔ and accelerated due to the high potential applied to the substrate 5, whereby the ionized clusters are caused to be deposited on the substrate 5 with increased energy. On the other hand, those clusters which remain unionized are deposited on the substrate with low energy on the order of 1 eV without being accelerated. In this conjunction, when different types of substances to be vaporized are placed in the different crucibles, respectively, e.g. Ga is placed in one crucible while As is in the other crucible, a film of a compound of different substances, e.g. GaAs, can be formed. On the other hand, when same substance is contained in all the crucibles, the speed at which the film is formed can be increased as compared with the process in which only one crucible is employed.

It should however be noted that in the case of the cluster beam deposition technique mentioned above, the film is also formed uniformly over the whole surface of the substrate. Consequently, when selective film formation on predetermined regions is desired, a number of additional processes such as described hereinbefore are required, to a disadvantage.

FIG. 4 shows a further example of the hitherto known cluster ion beam deposition technique. Referring to the figure, a vacuum chamber 2 connected to a vacuum source such as a vacuum pump (not shown) through an evacuation pipe 1 accomodates therein a crucible 9 containing a material or substance 3 to be vaporized for deposition. The crucible 9 is provided with a multi-orifice nozzle 10 for guiding and blowing off the vapor from the crucible 9. In opposition to the multi-orifice nozzle 10, there is disposed a substrate holder 6 imparted with electrically heating function, which holder 6 serves for supporting a substrate 5 to be deposited with the vaporized material.

The crucible 9 is heated by means of electron beam irradiation apparatus 11, whereby the material 3 to be evaporated is molten and vaporized. The vapor blown off through the multi-orifice nozzle 10 under a pressure which is determined by the configuration factor of the nozzle orifices and the pressure within the crucible 9 which is higher than that of the vacuum chamber by several orders of magnitude form atom clouds or clusters each including several tens to several thousands of loosely combined atoms, the clusters flying toward the substrate 5 to be deposited thereon with relatively low energy on the order of 1 eV. When the clusters encounter flux of electrons in the course of travelling toward the substrate, a part of the clusters is ionized (i.e. electrically charged) and subjected to acceleration by means of an electrode 12 of a high potential, resulting in that the ionized clusters are deposited on the substrate 5 with high energy on the order of several KeV.

Also in the case of the above mentioned ionized cluster beam deposition technique, the film is formed over the whole surface of the substrate, requiring thus a number of additional processes for forming selectively the film at desired regions of the substrate, to a great disadvantage.

It is therefore an object of the present invention to provide an ion beam type film forming method which is overcomes the drawbacks of the hitherto known cluster ion deposition techniques described above and which is capable of forming a film of high quality selectively at desired regions of a substrate by using a focussed cluster beam.

Another object of the present invention is to provide an apparatus for carrying out the method mentioned above.

In view of the above and other objects which will be apparent as description proceeds, it is proposed according to a general aspect of the present invention that for directing the cluster ion beam to a desired region of a substrate, the electrically charged or ionized cluster beam is focussed and deflected, if necessary, through an electrostatic lens system so that the ionized clusters are directed and deposited on the substrate at the desired region or regions, as the result of which the beam density and hence the density of deposition are increased at the desired regions while the deposition density is decreased at the other regions. Accordingly, through etching the film thus formed to a slight extent sufficiently for the removal of the low density deposition, the deposited film can remain only at the desired regions. According to the teaching of the invention, many processes required in the hitherto known methods for effecting the patterning can be spared, to a great advantage.

According to an aspect of the invention, there is provided an ion beam apparatus which comprises an enclosure defining a chamber of high vacuum in which a crucible for producing vapor of a material, ionizing means, ion accelerating means, and a substrate to be deposited with the vaporized material to thereby form a film thereon are disposed. An accelerating voltage is applied across the crucible and the accelerating means such that the crucible is of positive polarity while the accelerating means is of negative polarity. The material contained in the crucible is vaporized by heating. A pressure difference is maintained between the vapor pressure in the crucible and in the vacuum chamber. The crucible is provided with a small hole for ejecting the vapor into the vacuum chamber to thereby form atom clouds referred to as clusters under adiabatic expansion and supercooling, a part of the clusters being ionized through irradiation of electrons by the ionizing means and accelerated by the accelerating means so that the ionized and accelerated clusters deposit on the substrate to form a thin film thereon. The apparatus further comprises an electrostatic optical system interposed between the cluster ionizing region and the substrate to be deposited with the ionized clusters, wherein the electrostatic optical system serves to focus the ionized clusters onto the substrate to form the thin film thereon through deposition of the ionized clusters.

In a preferred embodiment of the invention, the ion beam apparatus further includes a deflecting electrode for separating the ionized clusters from neutral clusters so that the ionized clusters are focussed onto the substrate to deposit thereon.

In another preferred embodiment of the invention, the ion beam apparatus further includes a spatial filter having an opening at a location substantially coinciding with the focussed portion of the ionized cluster beam, to allow the ionized clusters to be extracted selectively for deposition of the substrate.

In accordance with a further preferred embodiment of the invention, the ion beam apparatus includes a partition wall which divides the vacuum chamber into a source space in which the crucible containing the material to be vaporized is disposed and a deposition space in which the substrate is disposed. The partition wall is provided with a through-hole of a small size. A focussing lens system is disposed between the partition plate and the ionizing means for ionizing the clusters ejected from the crucible for thereby focussing the ionized clusters at the aforementioned through-hole.

The ion beam deposition apparatus may include additionally deposition enhancing and/or improving means provided in association with the deposition space in which the substrate is disposed.

With the apparatus of the structures described above, a film can be formed on a substrate selectively at desired regions with significantly increased accuracy or precision and high controllability.

The present invention will be more apparent from the following detailed description taken in conjunction with the accompanying drawings, in which.

Now, the invention will be described in detail in conjunction with the preferred embodiments thereof.

Figure 1:
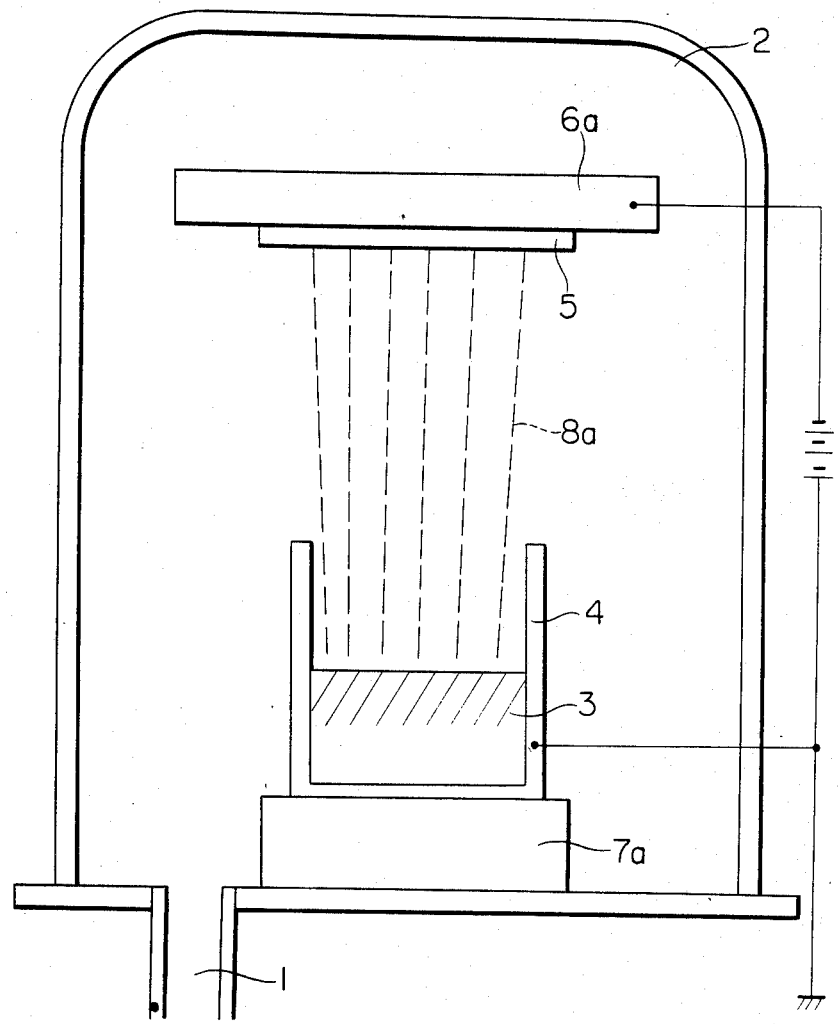
FIGS. 1 to 4 are views for illustrating the relevant prior art.
Figure 2:
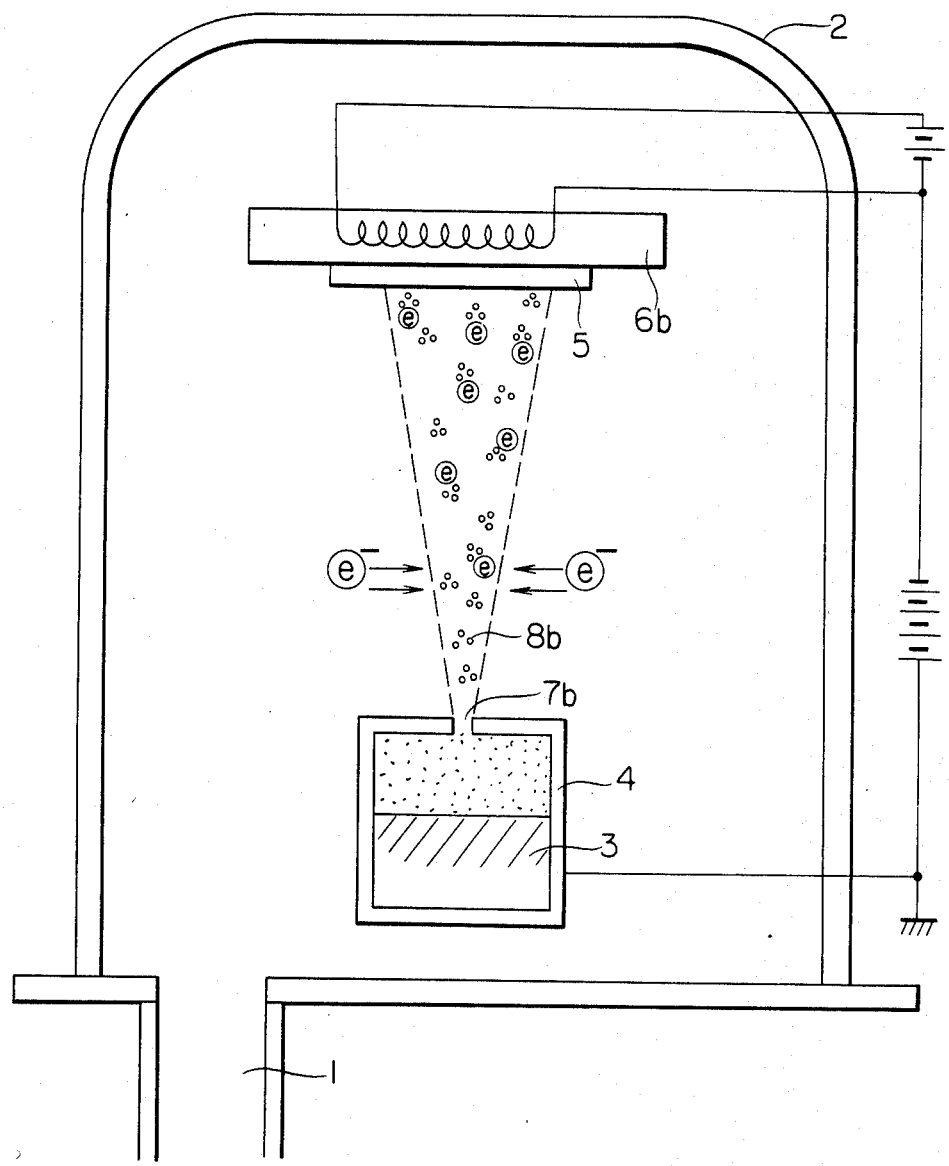
Figure 3:
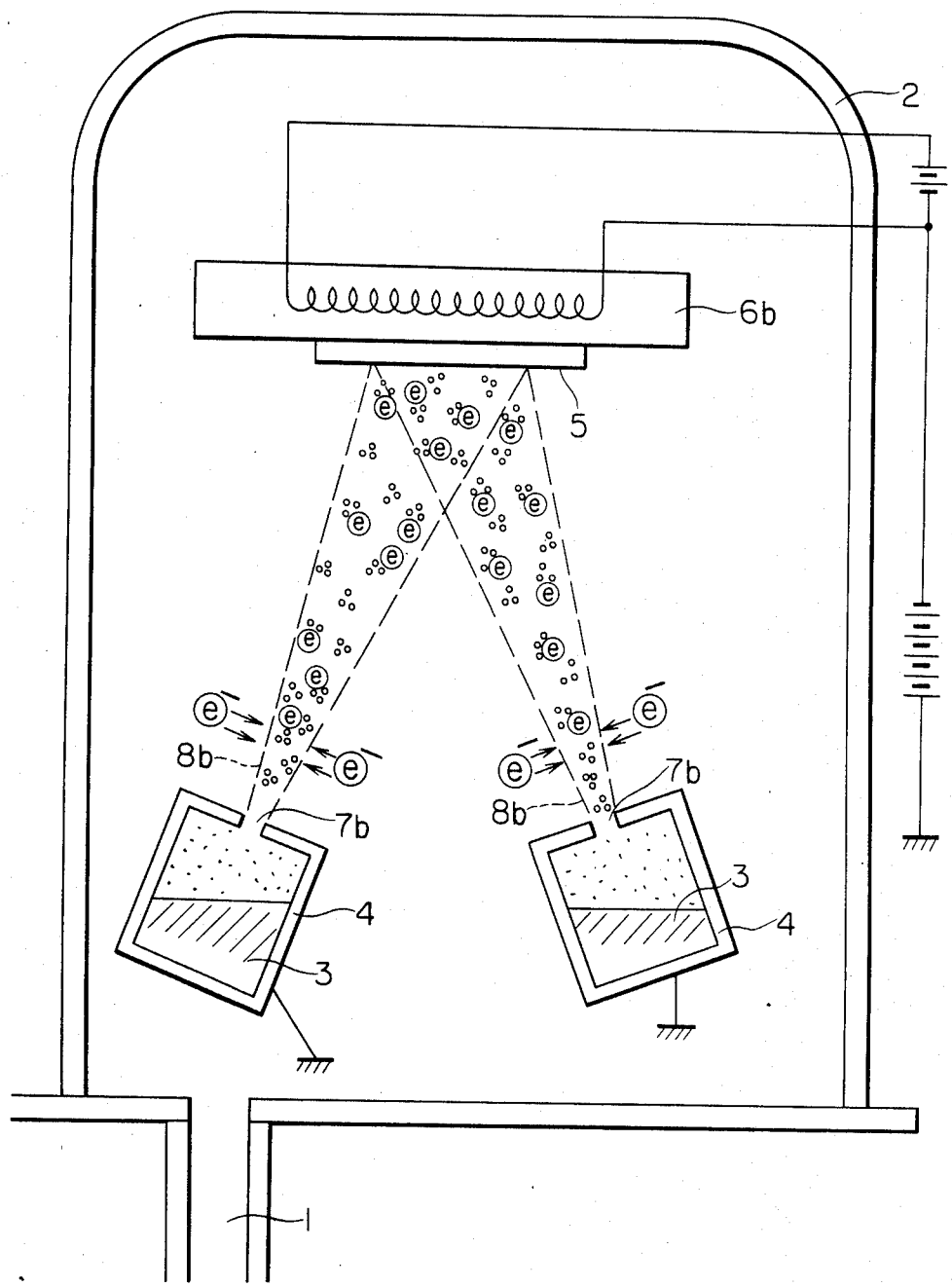
Figure 4:
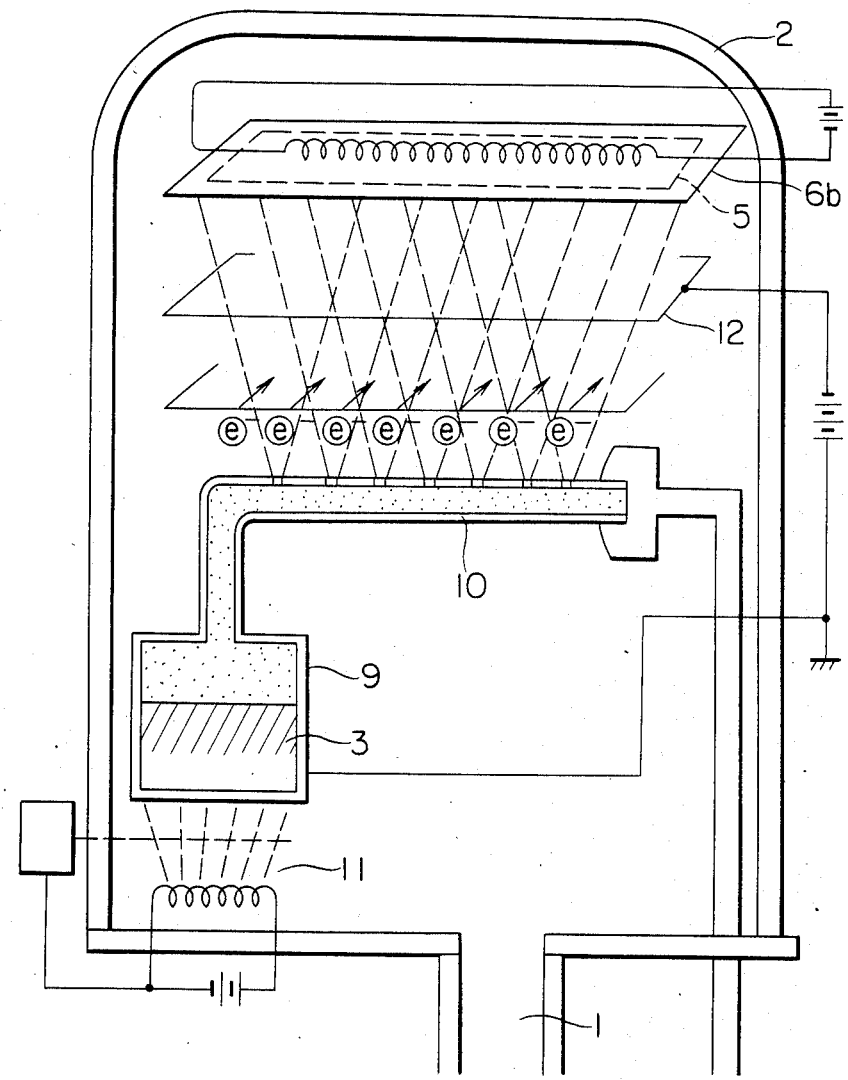
Figure 5:
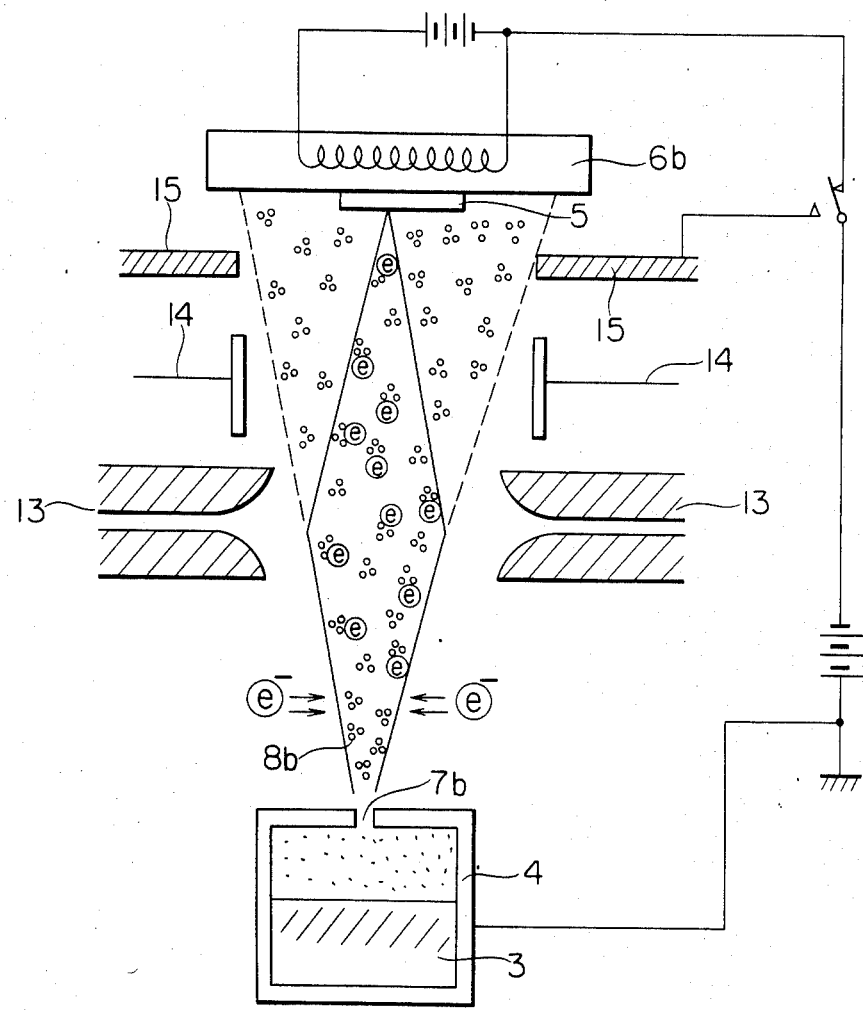
FIG. 5 is a view showing schematically a general arrangement of an ionized cluster beam deposition apparatus according to an embodiment of the present invention.

FIG. 5 is a view showing schematically a construction of a cluster ion beam apparatus according to an exemplary embodiment of the present invention. A crucible 4 containing a material or substance to be vaporized for deposition and a substrate 5 are disposed within a vacuum container (not shown). The substrate 5 is mounted on a substrate holder 6b which is maintained at a high temperature through electric heating (or heating by a lamp). A high voltage is applied across the crucible 4 and the substrate holder 6b so that the substrate 5 is maintained at a high potential level. The crucible 4 is adapted to be heated by electron beam irradiation means (not shown) to melt and vaporize the material 3 contained in the crucible 4. A nozzle 7b for blowing off or ejecting the vapor of evaporated material 3 is provided in the crucible 4. The vapor ejected from the crucible 4 through the nozzle 7b under a procedure determined by nozzle configuration factors and the pressure within the crucible 4 which is higher than that of the vacuum chamber by several orders of magnitude forms clusters 8b each constituted by several tens to several thousands of loosely combined atoms. These clusters 8b run toward the substrate 5. By exposing the clusters 8b to the fluxes of electrons in the course of running toward the substrate 5, a part of the clusters 8b is electrically charged or ionized and accelerated toward the substrate 5 of the high potential, to deposit thereon with high energy. At that time, the cluster 8b strikes or bombards the surface of the substrate to cleanse it, while the weak bond between atoms constituting the cluster is broken, to thereby allow atoms of the vaporized material 3 to migrate on and along the surface of the substrate 5 until the atoms become stationary in the stable state. On the other hand, the neutral clusters which have not been electrically charged or ionized are deposited on the substrate surface with low energy without being accelerated, whereupon the weak bond among atoms is broken to allow atoms to migrate on and along the substrate surface until they become stationary at the stable location. An electrostatic lens system 13 is disposed between the nozzle 7b and the substrate 5 at a position located downstream of the ionizing region. Through this electrostatic lens 13, the ionized clusters are focussed to form a spot of minute size on the substrate 5, wherein the atoms impinging on the surface of the substrate become stationary at the most stable position after migration of the surface of the substrate. In this connection, it is important to note that the thickness of film formed at the location corresponding to the focussed fine spot differs remarkably from the thickness of film formed by the neutral clusters deposited at angles of diffusion without being focussed.

Assuming now that the overall clusters are deposited on the substrate in a bundle of 100 mm in diameter and that 5% of the ionized clusters is focussed into a beam of 1 mm in diameter, the speed of film formation by the clusters which are not focussed is about 0.2% of the speed at which the film is formed through deposition of the focussed cluster beam. Accordingly, at the time when the ionized and focussed clusters have been deposited at a desired region at a thickness corresponding to 100% of the desired value, the thickness of deposition of the vaporized material 3 at the other unwanted region of the substrate surface is 0.2%. Accordingly, by etching away the material as deposited in thickness corresponding to 0.2% of the desired value, the substrate having the film formed only at the desired region can be obtained, whereby the lithographyical etching involving complicated and troublesome processes can be rendered unnecessary.

By providing additionally a pair of deflecting electrodes 14, it is possible to scan the substrate with the ionized cluster beam in horizontal direction, whereby the film can be formed not only at a fixed point or location but also in a linear form or pattern. When another pair of deflecting electrodes is provided to deflect the ionized cluster beam in the direction vertical to the scanning direction, it is possible to form the film in any desired shape or configuration. Of course, by moving the substrate holder 6b in the horizontal (X) and vertical (Y) directions in place of using the paired deflecting electrodes, similar scanning effect can be attained. However, in practical applications, the use of the deflection electrode system is more preferred because of high controllability as well as high scanning speed. By realizing the deflection of the ionized cluster beam at an increased speed over an enlarged angular range so that the beam can be deflected outside of the substrate, a so-called blanking which means interruption of the film formation can be realized to enhance significantly the freedom of operation of the cluster beam type deposition apparatus according to the illustrated embodiment.

When the presence of high potential at the substrate is undesirable for some reasons, an accelerating electrode 15 may be separately provided. The same holds true for all the embodiments described hereinafter.

Figure 6A:
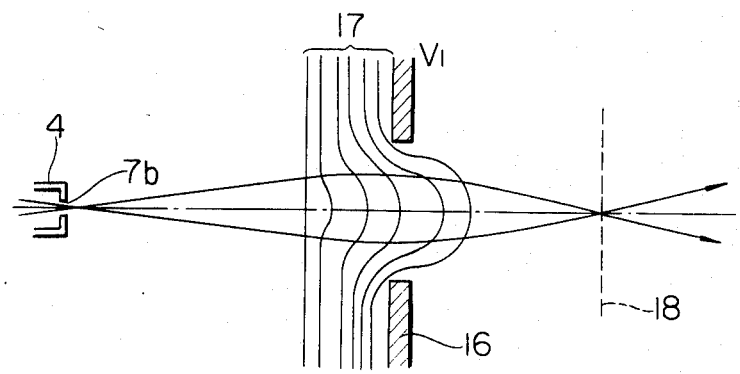
FIGS. 6a to 6c, 7a to 7d and 8a to 8c are views for illustrating structures of various electrostatic lens systems which can be employed in the apparatus according to the invention.
Figure 6B:
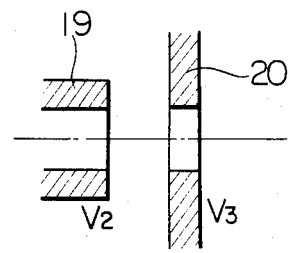
Figure 6C:
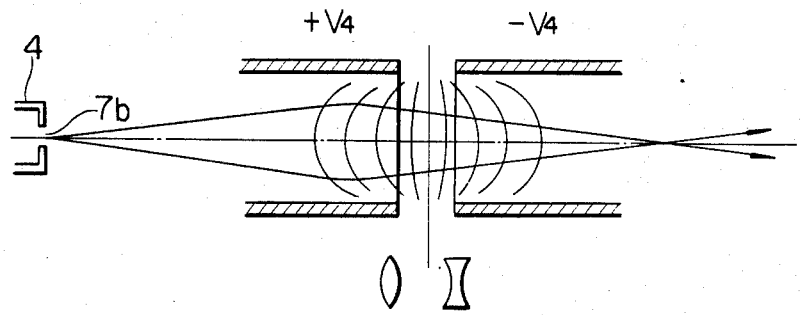

FIGS. 6a to 6c show, by way of example, structures of the electrostatic lens sysstem which can be employed in the apparatus according to the present invention. The lens shown in FIG. 6a is constituted by a disc having a circular aperture formed at a center. Of the clusters ejected through the nozzle 7b of the crucible 4, those clusters which are ionized are forced to follow paths curved or bent under electric field distributed in the vicinity of the circularly apertured disc lens 16, which field is generated by the voltage $V_1$ applied to the lens disc 16, resulting in that the ionized clusters are focussed on a focal plane 18. FIG. 6b shows a structure of a bi-potential lens system which includes a cylindrical lens 19 and an electrode plate 20 having a circular bore or aperture formed therein, a voltage $V_2$ being applied to the cylindrical electrode 19 while a voltage $V_3$ is applied to the electrode 20. Further, FIG. 6c shows a structure of cylindrical accelerator lens system composed of a pair of coaxially arrayed cylindrical electrodes to which voltages $+V_4$ and $-V_4$ are applied, respectively.

Figure 7A:
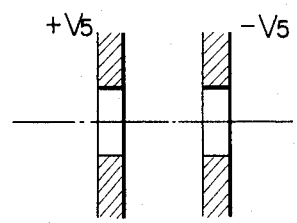
Figure 7B:
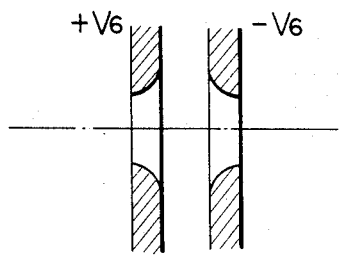
Figure 7C:
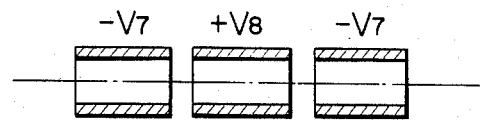
Figure 7D:
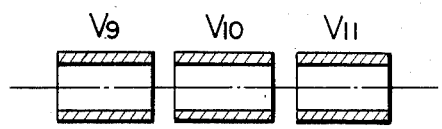

FIG. 7a shows a disc type acceleration lens system which are constituted by a pair of discs having respective circular apertures disposed coaxially and to which voltages $+V_5$ and $-V_5$ are applied, respectively. Further, FIG. 7b shows a Butler type twin acceleration lens system composed of lens elements each formed with such a curved surface that an equi-potential plane is realized which minimizes geometrical aberations, both lens elements being applied with voltages $+V_6$ and $-V_6$, respectively. FIG. 7c shows an Einzel type triplet cylindrical lens system composed of three coaxially arrayed cylindrical lens elements to which voltages $-V_7$, $+V_8$ and $-V_7$ are applied, respectively. FIG. 7d shows a triplet asymmetrical cylindrical lens system in which three cylindrical lenses juxtaposed coaxially are coupled to three different voltages $V_9$, $V_{10}$ and $V_{11}$, respectively.

Figure 8A:
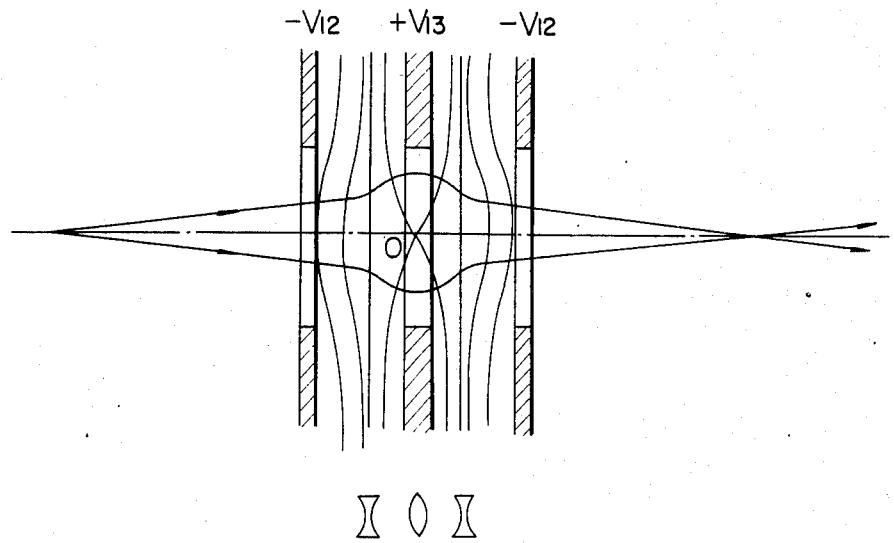
Figure 8B:
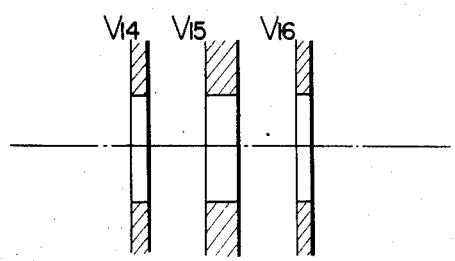
Figure 8C:
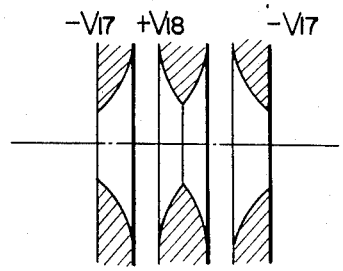

FIG. 8a shows an Einzel type triplet disc lens system which comprises a combination of three disc lenses having respective circular apertures coaxially aligned and coupled to voltages $-V_{12}$, $+V_{13}$ and $-V_{12}$, respectively. Further, FIG. 8b shows a disc type triplet asymmetrical lens system constituted by a combination of three discs having respective apertures coaxially aligned and coupled to different voltages $V_{14}$, $V_{15}$ and $V_{16}$, respectively. Finally, FIG. 8c shows a Butler type triplet symmetrical lens system comprising three lens elements to which voltages $-V_{17}$, $+V_{18}$ and $-V_{17}$ are applied, respectively.

The various electrostatic lenses mentioned above can be conveniently employed in the apparatus according to the invention.

Figure 9A:
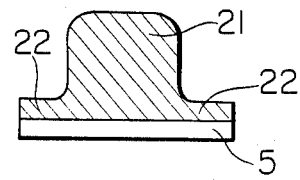
FIGS. 9a and 9b are sectional views for illustrating configuration or profile of a film formed on a substrate through vapor deposition effected by using the apparatus shown in FIG. 5.
Figure 9B:
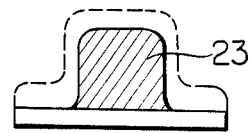

FIGS. 9a and 9b illustrate in sectional views a configuration or profile of the film formed through the deposition process described hereinbefore in conjunction with FIG. 5. It will be seen that a thick film portion 21 is formed at a center region of the substrate 5 through the focussed cluster beam. On the other hand, a thin portion 22 of the film is formed through deposition of the neutral divergent clusters. By etching the film to only a small extent or depth corresponding to the thickness of the portion 22, the thin film portion 22 as well as surface portion of the thick-film 21 are removed, resulting in that only the required central film 23 can remain. In this way, the aimed process can be accomplished in a simplified and satisfactory manner.

Figure 10:
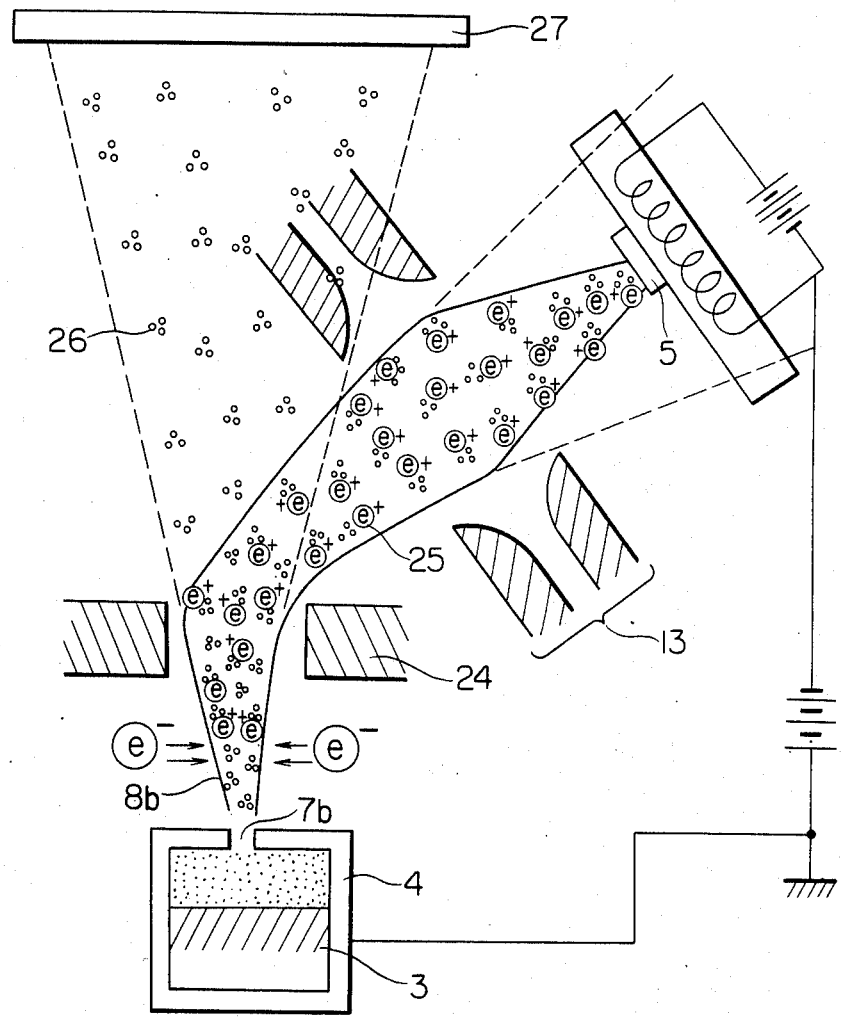
FIG. 10 shows an ionized cluster beam deposition apparatus according to another embodiment of the invention.

FIG. 10 shows a cluster beam type vapor deposition apparatus according to another embodiment of the invention. A material 3 to be vaporized for deposition is contained in a crucible 4 and heated by heating means such as electron beam irradiation means (not shown) and blown off or ejected through a nozzle 7b into a vacuum container (not shown) under adiabatic expansion to form clusters 8b, a part of which are ionized upon being subjected to flux of electrons ⓔ. The clusters 25 thus ionized are forced to follow a curved path under action of a deflecting electrode 24 to be thereby guided toward an electrostatic lens system 13 which serves to focus the ionized clusters onto the substrate 5 coupled to a high voltage, whereby the substrate is deposited with the focussed clusters accelerated under the influence of the potential of the substrate 5, resulting in that a film is formed on the substrate. On the other hand, those clusters 26 which are not ionized and thus neutral reach a beam stopper 27 to be blocked. With the arrangement of the apparatus described above, the film is formed only at the region of the substrate which are required to be deposited with the vaporized material 3, whereby the process for removing the unwanted peripheral film portion of small thickness (FIG. 9b) can be spared, to another advantage.

Figure 11:
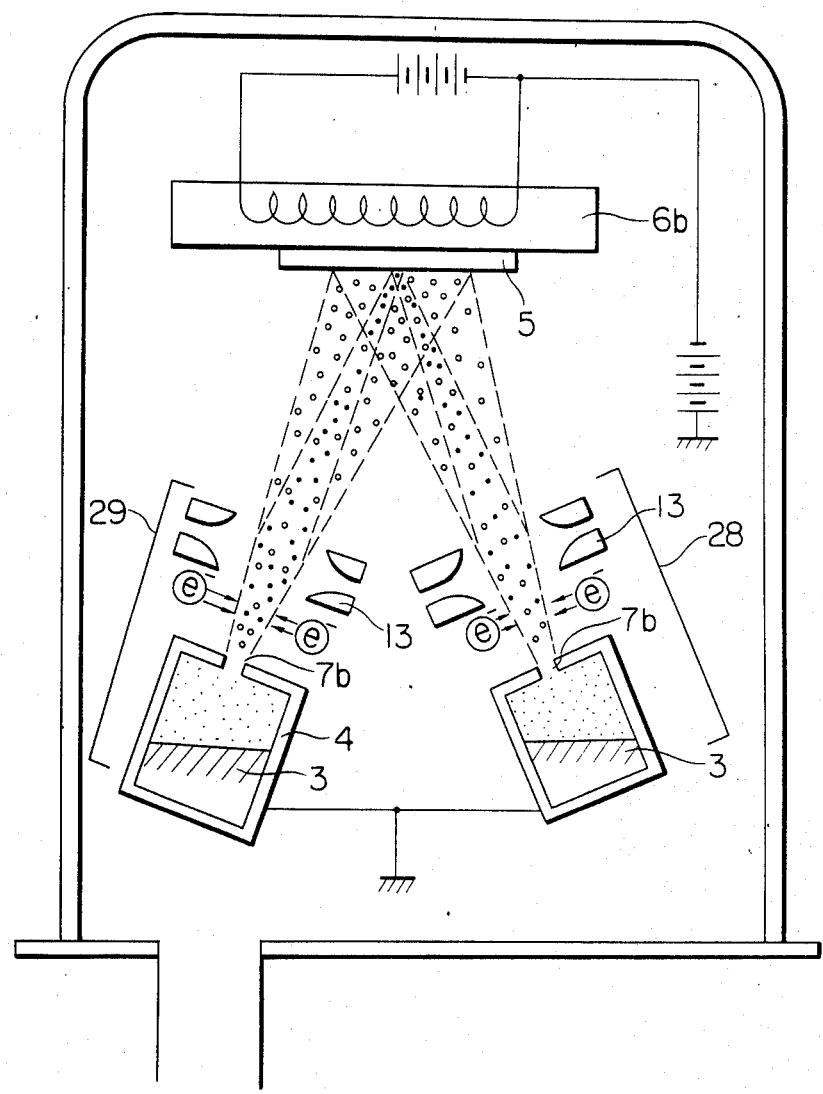
FIG. 11 is a view showing a version of the apparatus shown in FIG. 5.

FIG. 11 shows a version of the cluster beam type vapor deposition apparatus shown in FIG. 5. In the apparatus shown in FIG. 11, a plurality of cluster beam sources (two sources in the case of the illustrated embodiment) are provided. In case the two beam sources 28 and 29 contain a same material to be vaporized for deposition, the speed at which the film is formed on a substrate can be increased. On the other hand, when both beam sources contain the materials to be vaporized which differ each other (e.g. Ga and As), respectively, a film of compound or alloy can be formed in thickness of micron order.

Figure 12:
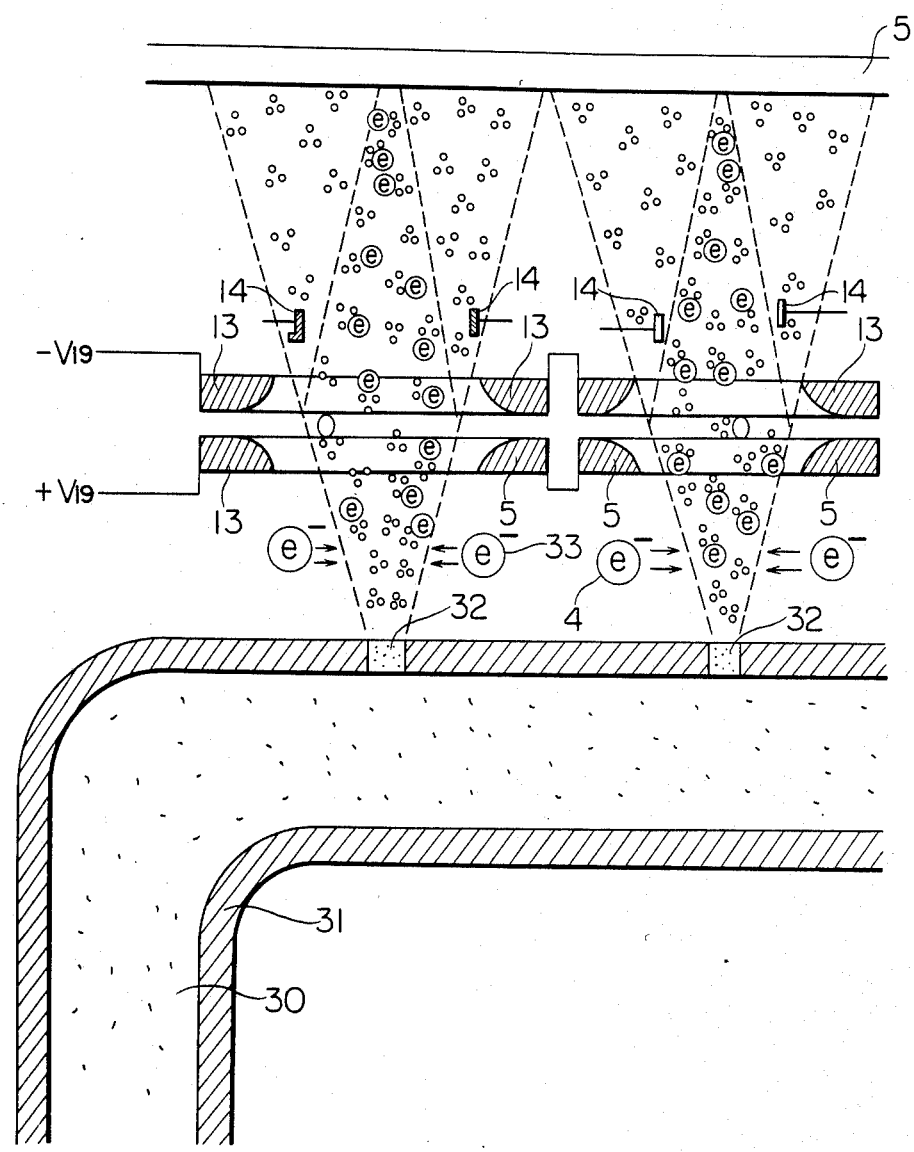
FIG. 12 is a view showing still another embodiment of the invention.

FIG. 12 shows a vapor deposition apparatus according to another embodiment of the invention. Vapor 30 of the material vaporized from a crucible (not shown) are introduced through a conduit 31 to a plurality of nozzles 32 arrayed in a row and ejected into a vacuum chamber to form clusters under adiabatic expansion. A part of the clusters are ionized (i.e. electrically charged) through irradiation of electron beams produced by electron beam sources 33 each provided in association with each of the nozzles. The ionized clusters are focussed by means of electrostatic lenses 13 provided in association with the respective nozzles onto a substrate 5 which is being moved in the direction perpendicular to the plane of the drawing, whereby the clusters are deposited on the desired surface regions of the substrate, respectively. The locations of the substrate which are to be deposited with the clusters of vaporized substance can readily be selectively determined by controlling correspondingly magnitude and/or polarity of the voltage applied to the deflecting electrodes 14. In this manner, a film can be formed selectively and locally on the moving substrate in a continuous manner. In the case of the instant embodiment, acceleration of the ionized clusters is accomplished by making use of a high voltage of $\pm V_{19}$ applied to the lens elements 13.

Figure 13A:
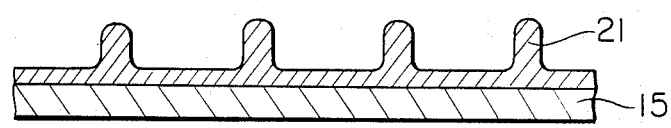
FIGS. 13a and 13b are views for illustrating sectional profiles of a film vapor-deposited on a substrate by using the apparatus shown in FIG. 12.
Figure 13B:
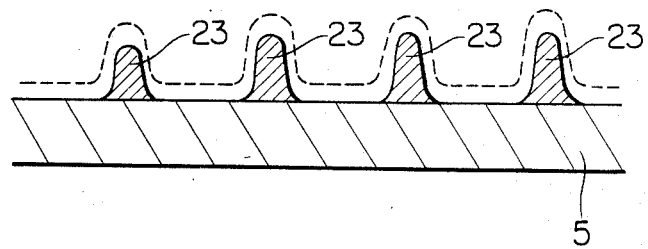

FIG. 13a shows in a sectional view a film 21 formed on the substrate 5 through deposition effected by the apparatus shown in FIG. 12. By etching slightly the surface portion of the film 21, there can remain only the film 23 of a desired thickness on the substrate, as is shown in FIG. 13b.

Figure 14A:
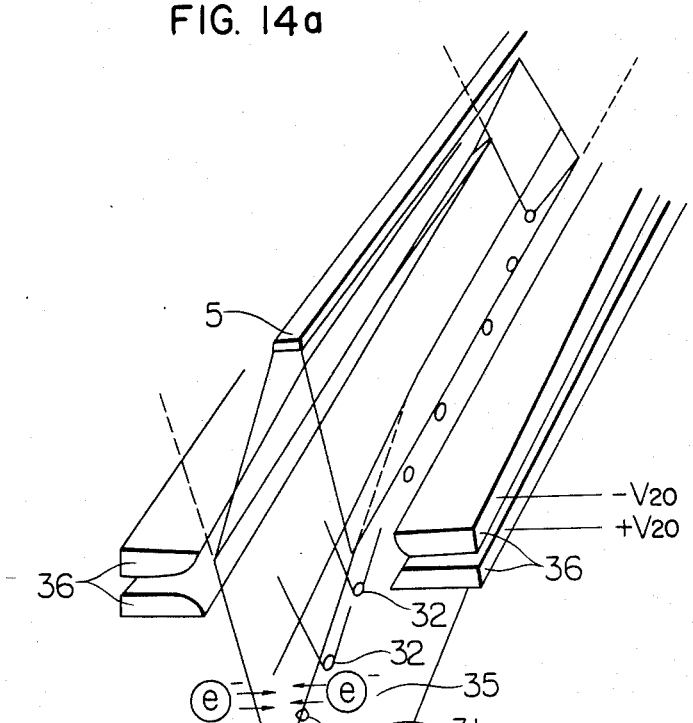
FIGS. 14a and 14b show a structure of a multinozzle beam source according to an embodiment of the invention.
Figure 14B:
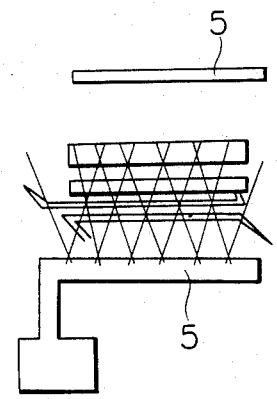

FIGS. 14a and 14b show a structure of the multinozzle beam source according to an embodiment of the invention. Vapor 30 of the substance for deposition produced in a crucible (not shown) flows through a conduit 31 to be ejected through a plurality of nozzles 32 into a high-vacuum chamber under adiabatic expansion to form the cluster bundles. Parts of clusters are ionized by the associated electron beam irradiation means 35, respectively, and focussed through an electrostatic prism or column lens system 36 onto the substrate 5 to deposit thereon. By virtue of such arrangement that the substrate 5 is moved in the direction in parallel with the row of the nozzles 32, the film can be formed on the substrate in the desired thickness in a satisfactory manner even when the substrate is fed at a high speed. In this way, by using the column lens system 36 in place of an axially symmetrical circular lens system, a film can be formed at a high speed on an elongated substrate of a narrow width with the aid of the multi-nozzle type vapor ejecting means. Acceleration of the ionized clusters can be accomplished by making use of the high voltage $\pm V_{20}$ applied to one of the column-like lens elements.

Figure 15:
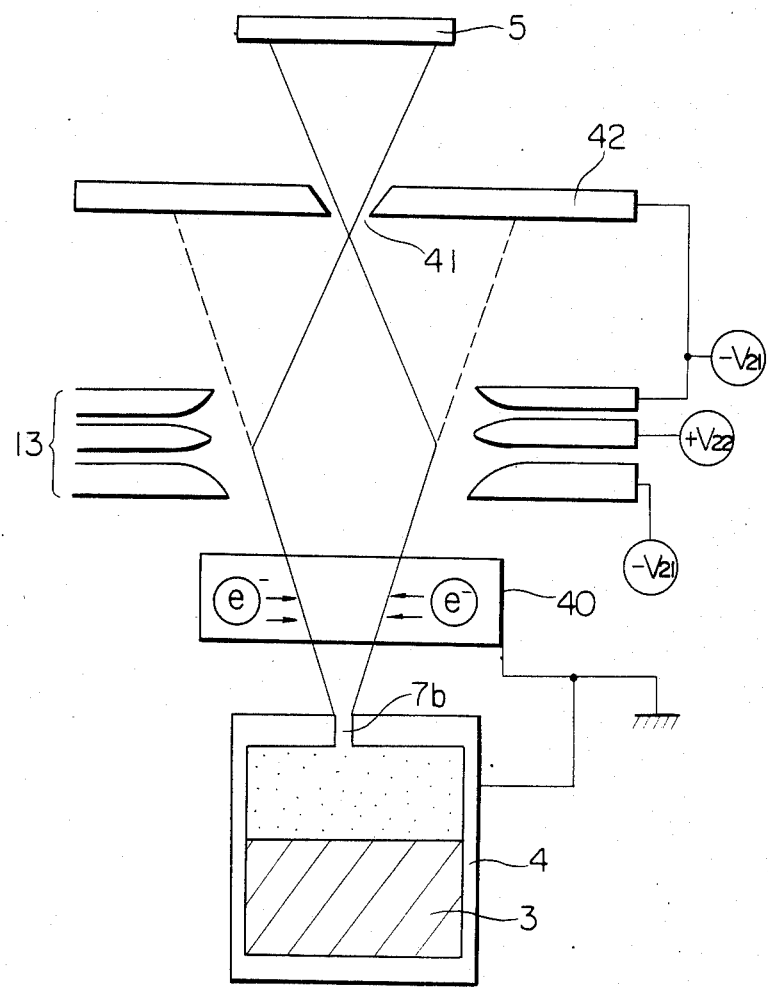
FIG. 15 is a view for illustrating schematically a structure of the vapor deposition apparatus according to a further embodiment of the invention.

FIG. 15 shows a general arrangement of the cluster beam type vapor deposition apparatus according to a further embodiment of the invention. A crucible 4 containing a material or substance 3 to be vaporized for deposition is heated by a heating means such as electron beam irradiation means (not shown) to a high temperature, whereby the resultant vapor of the material 3 is ejected from the crucible through a nozzle 7b under adiabatic expansion to form the clusters. A part of the clusters is ionized in an electron beam irradiation apparatus 40 and focussed by an electrostatic lens system 13. A spatial filter 42 having a pin hole 41 is disposed between the substrate 5 and the lens system 13 for intercepting a major part of the neutral clusters. Thus, the clusters which can pass through the pin hole 41 are by and large those clusters which are ionized. The clusters having passed through the pin hole 41 are deposited on the substrate 5. Thus, the film on the substrate can be formed substantially exclusively by those clusters which have been imparted with acceleration energy, whereby a dense film of an extremely high quality can be realized. In the apparatus, the first and third elements or electrodes and the spatial filter 42 of the electrostatic lens system 13 are applied with a high voltage $-V_{21}$ of negative polarity and used as the accelerating electrodes. The second electrode is applied with a voltage $+V_{21}$ of positive polarity.

Figure 16:
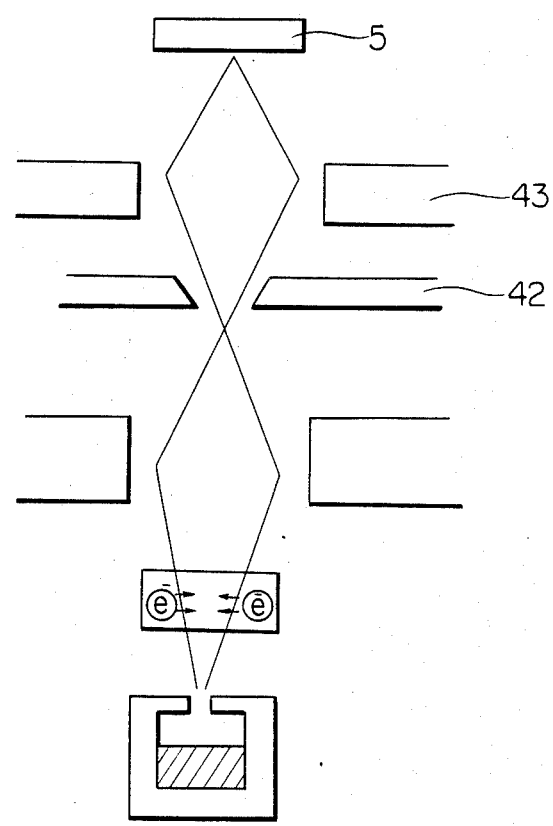
FIGS. 16, 17 and 18 are views showing, respectively, other exemplary embodiments of the invention.

FIG. 16 shows another embodiment of the invention according to which a second stage 43 of a focussing lens system is additionally disposed at a location downstream of the spatial filter 42 in the arrangement shown in FIG. 15. With the structure shown in FIG. 16, the film of high quality can be selectively formed on the substate 5 at the desired regions only by the ionized clusters.

Figure 17:
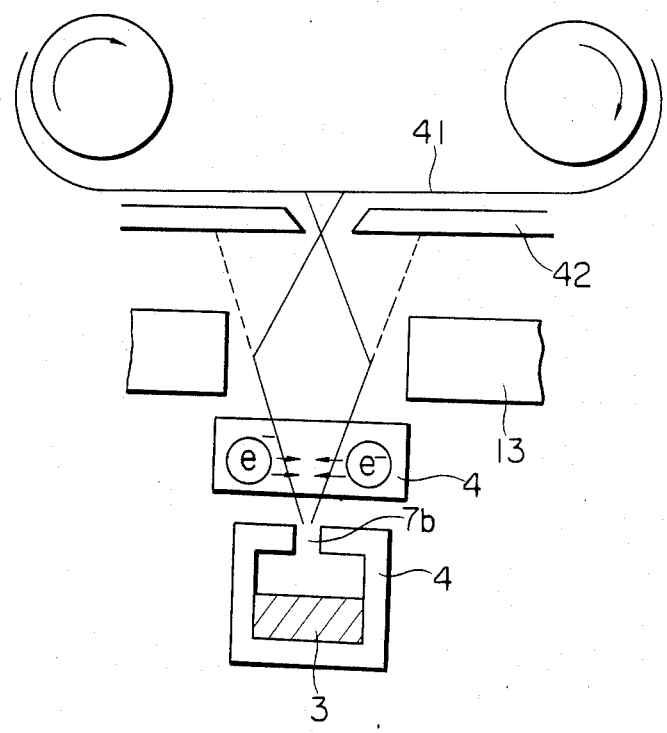

FIG. 17 shows still another embodiment of the invention which differs from the apparatus shown in FIG. 15 in respect that a continuous web or strip 41 dispensed from a wound substrate roll is disposed downstream of the spatial filter 42, wherein the web or strip of substrate is continuously fed and wound up with the film of high quality being formed thereon through deposition only of the ionized clusters.

Figure 18:
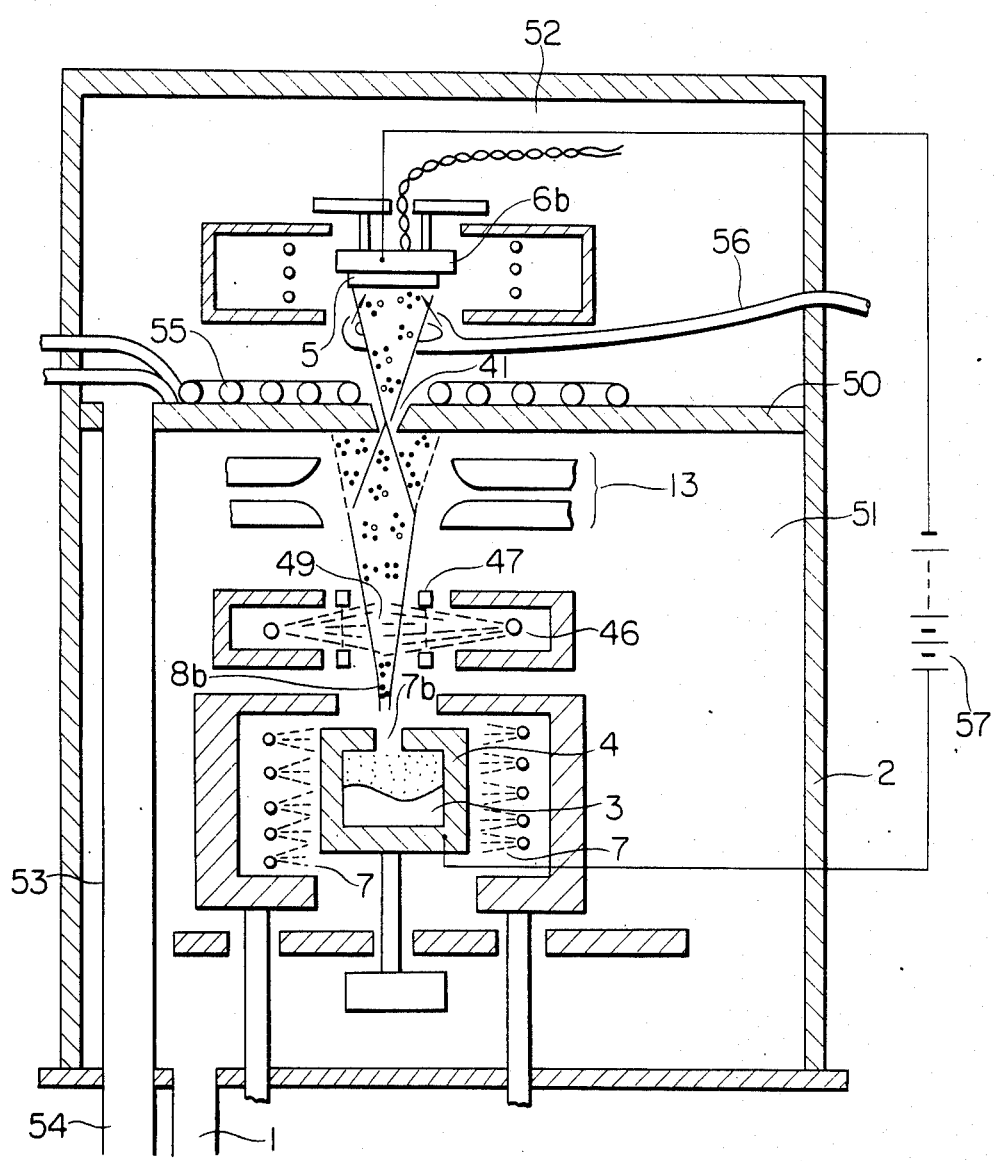

Next, the cluster beam type vapor deposition apparatus according to still another embodiment of the present invention will be described in detail by referring to FIG. 18.

The cluster beam type vapor deposition apparatus comprises a vacuum container 2 in which a crucible 4 containing a material or substance 3 to be vaporized for deposition and a substrate 5 to be deposited with the vaporized material 3. A high voltage denoted by 57 is applied across the crucible 4 and the substrate 5 to accelerate the clusters which are produced and discharged from the crucible 4. The clusters 8b are ionized by flux of electrons emitted from an electron emitting cathode 46 and introduced through grid 47 to deposit on the substrate 5 for forming a film thereon through vapor deposition.

Connected to the vacuum container 2 is an evacuation pipe 1 which in turn is connected to a vacuum pump (not shown) for reducing pressure within the vacuum container 2. As mentioned above, the crucible 4 and the substrate 5 are disposed within the vacuum container 2. The crucible 4 contains the material 3 to be vaporized for deposition of the substrate 5 and is provided with an electron beam irradiation means 7 which is disposed around the crucible 4 and constitutes the crucible heating means. The substrate 5 is held in contact with the substrate holder 6b which serves simultaneously as the substrate heating means. A high voltage 57 is applied across the substrate 5 and the crucible 4. Further, there is disposed between the substrate 5 and the crucible 4 the ionizing means which includes the ionizing electron emitting filament 46 and the grid 47 for drawing the electrons. The material 3 for vapor deposition is heated by the electron beam irradiation means 7 to be molten and vaporized, the resultant vapor being ejected through the nozzle 7b formed in the crucible 4 which is held at a high pressure due to vapor pressure. Since the vacuum container 2 is at a very low pressure, the vaporized material 3 undergoes adiabatic expansion to be supercooled, whereby clouds of atoms, i.e. the so-called clusters 8b are formed. The clusters 8b are caused to run toward the substrate 5 under influence of the high voltage 57. On the way to the substrate, the clusters 8b is exposed to fluxes of electrons produced by the ionizing means 46, 47 in the ionizing region 49, whereby a part of the clusters is ionized. The ionized clusters 8b are accelerated under the high voltage 57 and run toward the substrate 5 with increased energy (several eV to several ten eV per atom), while the remaining clusters 8b which are not ionized travel toward the substrate 5 with low energy (e.g. 0.1 to 1 eV per atom).

The substrate 5 is separated from the crucible 4 by an interposed intercepting plate 50 which has a small hole 41 formed therein, whereby a substrate chamber 52 and a vapor source chamber 51 are defined. There is disposed between the separating or partition plate 50 and the ionizing electron drawing grid 47 constituting a part of the ionizing means an electrostatic lens system 13 which serves as the focussing lens described hereinbefore. Additionally, the chamber containing the substrate 5, that is the substrate chamber 52, accommodates therein an evacuation pipe 54 connected to a vacuum means 53, a cooling pipe 55 for conducting a coolant and a conduit 56 for introducing a reaction gas, all of which constitute deposition enhancing and/or improving means described later on.

Of the clusters 8b, those which are ionized are focussed by means of the electrostatic lens 13 on the small hole 41. Thus, only the ionized clusters 8b are allowed to enter the substrate chamber 52 to deposit on the substrate 5, whereby a film of a high quality is formed through vapor deposition. Improved vapor deposition can be realized by the vapor-deposition enhancing/improving means described hereinafter.

Describing in more detail, the interior space of the vacuum container 2 is divided by the partition plate 50 into the substrate chamber 52 and the source chamber 51 as described above. The substrate chamber 52 accommodates therein the substrate 55 and the substrate holder 6b, while the source chamber 51 accommodates therein the crucible 4, the ionizing electron emitting filament 46, and the ionizing electron drawing grid 47.

The partition wall 50 has the through-hole (pin hole) 41 of a small size corresponding to that of the spot produced through focussing.

The electrostatic lens system 13 is interposed between the partition wall 50 and the ionizing electron drawing grid 47 and so arranged as to focus the ionized cluster 8b onto the small hole 41.

Next, operation of the apparatus will be described.

A part of the clusters 8b formed upon ejection of the vapor from the crucible 4 is ionized in the ionizing region 49, resulting in the state that the ionized clusters 8b are coexistent with the neutral clusters (i.e. the clusters which are not ionized). Both the ionized clusters and the neutral clusters travel toward the electrostatic lens system 13. The ionized clusters 8b are focussed by the electrostatic lens 13 to a spot of minute size. On the other hand, the neutral clusters fly straight. Because the pin hole 41 is formed in the partition plate 50 at the position which coincides with the focal points of the electrostatic lens 13, the ionized clusters 8b pass through the small hole 41 to enter the substrate chamber 52. On the other hand, the neutral clusters are intercepted by the partition plate 50 and inhibited from entering the substrate chamber 52. In this way, only the ionized clusters 8b are allowed to deposit on the substrate 5. Since the ionized clusters 8b are deposited on the substrate 5 with high energy as described above, there can be formed a deposited film of high quality on the substrate 5.

On the other hand, impurity-gas produced around the crucible 4 is prevented from flowing into the substrate chamber 52 by means of the partition plate 50, thus contributing to the formation of the film of higher quality.

Further, the substrate chamber 52 is provided with the vacuum means 53 which serves as the deposition enhancing/improving means. The vacuum means 53 includes the evacuation pipe 54 and a vacuum source (not shown) to which the pipe 54 is connected and operates to highly evacuate within the substrate chamber 52. By virtue of these evacuating means (53, 54), the quality of the film formed through the vapor deposition can be further improved. Moreover, there is disposed within the substrate chamber 52 the coolant conduit 55 which also serves as the deposition enhancing/improving means. The coolant conduit 55 conducts liquid nitrogen which is typical one of the coolants. Through the cooling action of the coolant conduit 55, the degree of vacuum within the substrate 52 is increased to thereby assure the formation of the film of an excellent quality.

Besides, as the means for improving further the deposition, there is disposed within the substrate chamber 52 the reaction gas introducing conduit 56 which serves to bring a reaction gas generated by an appropriate source (not shown) into contact with the substrate 5 for promoting or activating the deposition reaction, whereby the deposition as well as the film quality is further improved. The reaction gas is prevented from entering the source chamber 51 by means of the partition wall 50, whereby the componenets located within the source chamber 51 are protected from deterioration due to the reaction gas, increasing the use life of the apparatus, to an advantage.

In the illustrated embodiment, the electrostatic lens system is employed as the cluster focussing lens. However, it should be preciated that the invention is not restricted to the use of such lens. Further, the invention is not restricted to the deposition improving means disclosed herein.

The impurity gas produced around the crucible 4 is positively prevented from reaching the substrate 5, as the result of which contamination of the film with the impurity gas is excluded, to assure the more improved quality of the film formed through deposition. Further, the neutral clusters are inhibited from being deposited on the surface of the substrate with only the clusters 8b of high energy being allowed to deposit and migrate on the substrate surface to thereby assure the formation of the film having an excellently high quality.

Besides, the apparatus can enjoy an increased use life.

As will be appreciated from the foregoing description, it is possible according to the teaching of the present invention to form selectively the high quality film on a substrate at desired regions with high accuracy and precision. Further, by providing the spatial filter for suppressing the major part of the neutral clusters, the film quality is more improved, while controllability of the cluster beam can be enhanced, making unnecessary the etching process for removing the pheripheral or extra film portion. Moreover, because the impurity gas produced around the crucible is positively prevented from contacting with the substrate, no contamination of the deposited film occurs, to contribute to further improvement of the film quality.

We claim:

1. An ion beam apparatus comprising an enclosure defining a chamber of high vacuum, said chamber accommodating therein a furnace for producing vapor of a material contained therein, ionizing means, ion accelerating means, and an element to be deposited with said vaporized material to thereby form a film thereon, wherein an accelerating voltage is supplied across said furnace and said accelerating means such that said furnace is of positive polarity while said accelerating means is of negative polarity, said material contained in said vapor generating furnace being vaporized under heating, a pressure difference being maintained between vapor pressure within said furnace and said vacuum chamber, said furnace being provided with an opening for ejecting the vapor of said material into said vacuum chamber to thereby form atom clouds referred to as clusters under adiabatic expansion and supercooling, a part of said clusters being ionized through irradiation of an electron beam by said ionizing means and accelerated by said accelerating means so that said ionized and accelerated clusters deposit on said element to form a thin film, an electrostatic optical system interposed between the cluster ionizing region and said element to be deposited with said ionized clusters, and means for preventing contamination of the thin film formed on said element including a partition plate disposed between said element to be deposited with the ionized clusters and at least a part of said electrostatic optical system, said partition plate having an opening formed therein, wherein said electrostatic optical system serves to change a path to be followed by said ionized clusters to focus said ionized clusters at said opening of said partition plate so as to only enable said focused ionized clusters to pass through said partition plate to form an uncontaminated thin film on said element through deposition of said ionized clusters, and vapor deposition enhancing/improving means being provided in association with a deposition chamber defined by said partition plate in which said element is disposed, said vapor deposition enhancing/improving means including evacuating means connected to said deposition chamber for producing a vacuum in said deposition chamber.

2. An ion beam apparatus according to claim 1, wherein said opening formed in said partition plate is a pin hole, and said partition plate serves as a spatial filter for enabling only said focused ionized clusters to pass therethrough to be deposited on said element.

3. An ion beam apparatus according to claim 1, further including heating means for heating said element to be deposited with the vaporized material.

4. An ion beam apparatus according to claim 1, wherein said vapor deposition enhancing/improving means includes cooling means disposed within said deposition chamber for circulating a coolant.

5. An ion beam apparatus according to claim 1, wherein said vapor deposition enhancing/improving means includes reaction gas introducing means for bringing a reaction gas in contact with said element to be deposited with the vaporized material.

6. An ion beam apparatus comprising an enclosure defining a chamber of high vacuum, said chamber accommodating therein a furnace for producing vapor of a material contained therein, ionizing means, ion accelerating means, and an element to be deposited with said vaporized material to thereby form a film thereon, wherein an accelerating voltage is applied across said furnace and said accelerating means such that said furnace is of positive polarity while said accelerating means is of negative polarity, said material contained in said vapor generating furnace being vaporized under heating, a pressure difference being maintained between the vapor pressure within said furnace and said vacuum chamber, said furnace being provided with an opening for ejecting the vapor of said material into said vacuum chamber to thereby form atom clouds referred to as clusters under adiabatic expansion and supercooling, a part of said clusters being ionized through irradiation of an electron beam by said ionizing means and accelerated by said accelerating means so that said ionized and accelerated clusters deposit on said element to form a thin film, said apparatus further comprising electrostatic optical system interposed between the cluster ionizing region and said element to be deposited with said ionized clusters, wherein said electrostatic optical system serves to change a path to be followed by said ionized clusters to thereby focus said ionized clusters onto said element to form the thin film on said element through deposition of said ionized cluster, and means for preventing contamination of the thin film formed on said element including a spatial filter having an opening at a location substantially coinciding with the focused portion of said ionized clusters, to only allow the ionized clusters to be extracted selectively for enabling an uncontaminated deposition on said element, said spatial filter being maintained at a negative potential for serving as an accelerating electrode for said ionized clusters.

* * * * *